(12) United States Patent
LaComb

(10) Patent No.: US 12,381,373 B2
(45) Date of Patent: Aug. 5, 2025

(54) RADIATION MODE TAILORED SEMICONDUCTOR LASER

(71) Applicant: Ronald LaComb, W Greenwich, RI (US)

(72) Inventor: Ronald LaComb, W Greenwich, RI (US)

( * ) Notice: Subject to any disclaimer, the term of this patent is extended or adjusted under 35 U.S.C. 154(b) by 627 days.

(21) Appl. No.: 17/807,131

(22) Filed: Jun. 15, 2022

(65) Prior Publication Data
US 2022/0407291 A1 Dec. 22, 2022

Related U.S. Application Data

(60) Provisional application No. 63/212,695, filed on Jun. 20, 2021.

(51) Int. Cl.
*H01S 5/00* (2006.01)
*H01S 5/026* (2006.01)
(Continued)

(52) U.S. Cl.
CPC ............... *H01S 5/22* (2013.01); *H01S 5/026* (2013.01); *H01S 5/028* (2013.01); *H01S 5/04254* (2019.08); *H01S 5/1014* (2013.01); *H01S 5/1064* (2013.01); *H01S 5/125* (2013.01); *H01S 5/16* (2013.01); *H01S 5/2054* (2013.01); *H01S 2301/166* (2013.01)

(58) Field of Classification Search
CPC . H01S 5/22; H01S 5/026; H01S 5/028; H01S 5/04254; H01S 5/1014; H01S 5/1064; H01S 5/125; H01S 5/16; H01S 5/2054; H01S 2301/166
See application file for complete search history.

(56) References Cited

U.S. PATENT DOCUMENTS 6,256,330 B1 * 7/2001 LaComb ............... H01S 5/22
372/45.01
7,184,207 B1 2/2007 Walker et al.
(Continued)

OTHER PUBLICATIONS

A. Pietrzak et al., "1060-nm Ridge Waveguide Lasers Based on Extremely Wide Waveguides for 1.3-W Continuous-Wave Emission Into a Single Mode With FWHM Divergence Angle of 9° x 6°", IEEE Journal of Quantum Electronics, vol. 48, No. 5, pp. 568-575, May 2012, doi: 10.1109/JQE.2012.2184526.

*Primary Examiner* — Kinam Park
(74) *Attorney, Agent, or Firm* — Young Basile Hanlon & MacFarlane, P.C.

(57) ABSTRACT

The present disclosure relates to index guided semiconductor laser devices supporting wide single lateral mode operation for high power operation. A narrow channel ridge waveguide structure is presented which devices can be configured as single lateral multi-spectral high power semiconductor lasers, single frequency lasers, gain chips and semiconductor amplifiers. More specifically it relates to a means for increasing the lateral mode size over that of conventional index guided structures to increase the average output power typically limed by Catastrophic Optical Damage (COD) at the laser facet or by intensity related effects. This potentially allows the overall laser cavity length to be shortened for a given output power level to stabilize frequency locking with internal or external gratings to improve single frequency operation.

20 Claims, 3 Drawing Sheets

(51) Int. Cl.
  *H01S 5/028*   (2006.01)
  *H01S 5/042*   (2006.01)
  *H01S 5/10*    (2021.01)
  *H01S 5/125*   (2006.01)
  *H01S 5/22*    (2006.01)
  *H01S 5/16*    (2006.01)
  *H01S 5/20*    (2006.01)

(56) References Cited

U.S. PATENT DOCUMENTS

| | | |
|---|---|---|
| 11,988,872 B2 | 5/2024 | Prosyk et al. |
| 2004/0131310 A1 | 7/2004 | Walker |
| 2019/0245318 A1* | 8/2019 | LaComb ............... H01S 5/4043 |
| 2020/0381899 A1 | 12/2020 | Macquistan et al. |

* cited by examiner

RADIATION MODE TAILORED SEMICONDUCTOR LASER

This application claims the benefit of U.S. Provisional Application No. 63/212,695. The entire disclosure of the above application is incorporated herein by reference.

FIELD OF THE INVENTION

The present application relates to a laser system and method having a ridge waveguide type structure featuring narrow channel regions for tailoring modal attenuation to support wide single lateral mode operation thereby increasing the output power. Wide single lateral mode devices can be configured as single lateral multi-spectral high power semiconductor lasers, single frequency lasers, gain chips and semiconductor amplifiers. More specifically it relates to a means for increasing the lateral mode size over that of conventional index guided structures to increase the average output power typically limed by Catastrophic Optical Damage (COD) at the laser facet or by intensity related effects. The narrow channel index guiding structure supports single lateral modes wider than conventional ridge waveguide structures enabling higher output powers prior to the onset of COD compared to conventional structures. The structure features two parallel narrow channel structures creating a central waveguide along the channels in the longitudinal direction. The structure establishes a lateral waveguide structure with high index of refraction between the channels lower refractive index along the channels and high refractive index outside the channels with the change in refractive index between the regions related to the depth of the channels thereby establishing a waveguiding region between the channels. The channels are designed to be narrow in width compared to the widths of the lateral modes confined by the structure allowing for significant overlay of the mode tails into the outside region causing modal attenuation as the modes propagate down the channel. By tailoring the depth and width of the narrow channels modal attenuation can be tailored to favor single lateral mode operation for waveguides supporting a plurality of lateral modes. The radiation loss of higher order lateral modes is increased over that of the fundamental mode for their modal overlap with the outer region is greater. Alternately, for a given operational power, the cavity length can be shortened (with respect to conventional ridge waveguide type structures) to stabilize frequency locking with internal or external gratings to improve frequency stabilization as a function of operational power and thermal variations.

BACKGROUND

This section provides background information related to the present disclosure. This section provides background information related to the present disclosure. Conventional semiconductor laser structures consist of a direct bandgap semiconductor chip supporting a conventional diode structure with cleaved facets (mirrors) often coated with reflective coatings and electrical contacts, upon application of an applied bias current is injected in a central active layer generating photons which bounce back and forth between the two opposite mirrors, upon sufficient activation laser threshold is reached. The diode structure is formed within epitaxial layers consisting of n-type and p-type doped layers forming a perpendicular waveguide supporting a mode overlapping with a central active layer for photon generation. Conventional ridge waveguide RWG laser structures utilize a lateral waveguide formed by etched channels running the length of the laser cavity forming a central waveguide region to insure fundamental mode operation. Conventional RWG structures feature ridge waveguide widths less than the cut-off width (width at which higher order lateral modes are confined for a given index change between the channel and waveguide region) for higher order modes with channel widths sufficiently wide such that the modal energy of the supported fundamental mode outside the channel regions is negligible. Conventional III-V (GaAs and InP based) ridge waveguide structures feature a 3-5 micron wide ridge (waveguide region) formed between two etched channels 20-35 microns in width, supporting fundamental modes with corresponding widths. Narrow waveguide structures pertaining to this disclosure feature ridge widths greater than the modal cut-off width with narrow channel regions allowing significant overlap of modal profiles with the regions outside the channels (outer regions) causing the modes to attenuate as they propagate along the laser cavity with attenuation proportional to the modal overlap with the outer regions. As the modal overlap in the outer regions of the supported lateral modes scales with mode number, so does the attenuation thereby favoring fundamental mode operation for ridge widths larger than the cut-off width. Utilizing the narrow channel design single lateral mode operation can be supported for ridge widths ranging from 7-14 microns wide for InP and GaAs based structures, narrow channel widths for these designs range from 1-5 microns in width. The narrow channel waveguide structure can be utilized to form a gain chip by incorporating at least one low reflectivity mirror, by coupling the gain chip to an external grating an external cavity laser (ECL) is realizes which is capable of single frequency operation. The narrow channel RWG structure can include an integrated distributed Bragg gratings to form a distributed feedback laser (DFB) or a distributed Bragg reflector (DBR) laser also capable of single frequency operation. Alternatively, the narrow channel RWG structure can be coupled with a gain section to form a tapered amplifier device. By allowing for relatively wide lateral mode operation high power operation is achieved for all of these structures. The fundamental mode width ultimately limits the maximum output power the structure can achieve caused by catastrophic optical damage (COD) at the facet. In addition, laser operational factors are also influenced by the ridge width pertaining to the carrier injection profile and spatial hole burning altering the waveguide properties promoting the running of other higher lateral modes. Single lateral mode operation is established by providing a waveguide structure in the lateral direction which extends in the longitudinal direction which is typically formed by a ridge waveguide or buried waveguide structure. Single frequency operation is achieved by providing a frequency selective mirror to limit feedback and therefore laser action to a narrow spectrum of wavelengths (or frequencies). Conventional lateral waveguide structures form a lateral refractive index profile by etching channels about a ridge structure to form single mode waveguides. Typically, the index profile is designed to support a single lateral mode structure, an effective index profile is established by etching channels alongside an unetched region defining the ridge-width, the depth of the channels in conjunction with the epitaxial structure and wavelength define the effective index step between the channel and ridge sections. By limiting the ridge-width below a cutoff value single mode operation is insured. Typically, for conventional ridge waveguide structures the channel widths are made optically wide (typically around 2-5 microns or greater)

compared to the optical wavelength to insure single lateral mode operation. Typically, high power single mode operation limits ridge width and associated lateral mode widths to 1-4 microns for lasers operating in the visible and near infrared wavelength range. The narrow mode field limits the maximum output power to below the catastrophic optical damage (COD) limit. Typically, cavity length is increased to achieve maximum power performance, long cavity length devices support a large number of longitudinal modes which make frequency locking (by internal or external gratings) sensitive to thermal and current injection levels, further limiting operational power for single frequency applications.

OBJECTS AND ADVANTAGE

Power scaling of conventional semiconductor laser devices is limited by catastrophic optical damage (COD) at the facets. COD is caused by high intensity radiation at the facet essentially melting the semiconductor at the facet. Ridge waveguide structures are employed to insure fundamental lateral mode operation required for high beam quality. Attempts to widen the optical field by increasing the COD limit are hampered by the onset of higher order optical modes which degrades beam quality. The object of this invention is to provide a new type of laser structure allowing for wider fundamental mode operation thereby increasing the COD power limit while maintaining wide fundamental mode operation and high beam quality. This is accomplished by the narrow waveguide structure tailoring radiation losses while maximizing modal confinement factor (overlap of the fundamental mode with the gain confining regions) to favor fundamental mode operation thereby supporting fundamental lateral modes 2-4 times wider than conventional ridge waveguide structures, thereby increasing the COD power limit. The narrow waveguide ridge structure can by utilized to from a high power single frequency laser by incorporating a distributed Bragg mirror forming ether a Distributed Feed Back (DFB) structure, Distributed Bragg Reflector (DBR) structure or external cavity laser configuration by coupling a narrow channel RWG gain chip to an external grating (ether volumetric or fiber based). Gain chips can be designed utilizing the narrow channel ridge design ether by angling the cavity with respect to the facet or curving the waveguide at one end. Utilizing a high power narrow channel gain chip allows for shorter cavity lengths for a given power output supporting higher modal stability and better frequency locking.

SUMMARY

This section provides a general summary of the disclosure, and is not a comprehensive disclosure of its full scope or all of its features.

The present disclosure relates to a semiconductor laser system with an epitaxial structure including a diode structure comprising of a p-type and n-type doped layers forming a perpendicular waveguide supporting a fundamental perpendicular mode with significant modal overlap with a central active layer, electrical contacts made to both the n-type and p-type regions to apply a bias allowing current injection into the active layer creating photons by radiative recombination, cleaved facets serving as mirrors forms the laser resonator between the mirrors, a lateral waveguide structure including a central high refractive index region defined by two parallel narrow regions of lower refractive index with high refractive index outer regions all running parallel along the longitudinal direction, from facet to facet. The narrow channel lateral waveguide features a waveguide region of width greater than the cut-off width of conventional index guided waveguides allowing higher order modes to be confined, the lateral modes are centered in the waveguide region with modal-tails extending past the low refractive index narrow channels extending into the outer regions with higher refractive index, causing radiation loss of the modes as they propagate within the laser resonator. The extent of lateral modal overlap with the outer regions increases with mode number with the higher order modes having the highest degree of modal-overlap and therefore the greatest radiation losses. The channel structure is designed to tailor the modal attenuation due to radiation loss to favor fundamental mode operation for lateral waveguide widths greater than the cutoff width, thereby allowing for single lateral mode lasers supporting lateral mode widths wider than conventional ridge waveguide laser structures. Wide lateral mode lasers support relatively higher output powers before the onset of catastrophic optical damage at the laser facets. High power single frequency lasers can be realized by incorporating a grating within the laser resonator for wavelength selection, this can be utilized to increase modal stability by allowing for shorter overall cavity lengths for a given output power One aspect the present disclosure relates to a method of forming a semiconductor laser. The laser system may comprise of a longitudinal resonator formed by a lateral waveguide in a semiconductor epitaxial media housing a gain layer and perpendicular mode defined between two opposing cleaved facet mirrors. Unique to this resonator design, the lateral waveguide supports significant modal overlap for higher order modes with regions outside the channel regions of the lateral waveguide causing higher order lateral modes to radiate energy as they propagate within the laser resonator thereby favoring fundamental mode operation for lateral waveguides wider then the modal cutoff width (width at which higher order modes are supported) allowing for high power operation. The semiconductor epitaxial media contains an optically active layer and waveguide layers to establish an optical waveguide in the perpendicular direction, the semiconductor epitaxial layers also include p-type and n-type doping layers and top and bottom contacts to enable an applied current to create optical photons in the active layer when properly biased. The top electrical contact is centered over the lateral waveguide to establish a current injection profile and an associated optical gain confining region within the active layer. Upon sufficient current injection, laser threshold is reached, and the laser supports wide single lateral mode operation.

In another aspect the present disclosure relates to a semiconductor laser employing a ridge waveguide structure supporting a plurality of lateral modes featuring narrow channels to tailor radiation losses of the supported modes causing the fundamental mode to have the lowest radiation loss thereby favoring fundamental mode operation under sufficient applied bias.

In another aspect the present disclosure relates to a semiconductor laser employing a narrow channel ridge waveguide structure including a distributed Bragg reflector (DBR) to provide wavelength selectivity of the radial emission. Upon sufficient current injection into the active layer the laser supports wavelength selective efficient emission allowing single frequency operation.

In another aspect the present disclosure relates to a semiconductor laser with a narrow channel ridge waveguide structure including a distributed feedback (DFB) region supporting single frequency operation.

In another aspect the present disclosure relates to a semiconductor laser featuring a narrow channel ridge waveguide with one facet anti-reflection coated to create a gain chip, said gain chip can be coupled to an external grating allowing single frequency operation.

Further areas of applicability will become apparent from the description provided herein. The description and specific examples in this summary are intended for purposes of illustration only and are not intended to limit the scope of the present disclosure.

The drawings described herein are for illustrative purposes only of selected embodiments and not all possible implementations, and are not intended to limit the scope of the present disclosure. The accompanying drawings, which are incorporated into and constitute a part of the specification, illustrate specific embodiments of the apparatus, systems, and methods and, together with the general description given above, and the detailed description of specific embodiments serve to explain the principles of the apparatus, systems, and methods.

DETAILED DESCRIPTION

Figure 1:
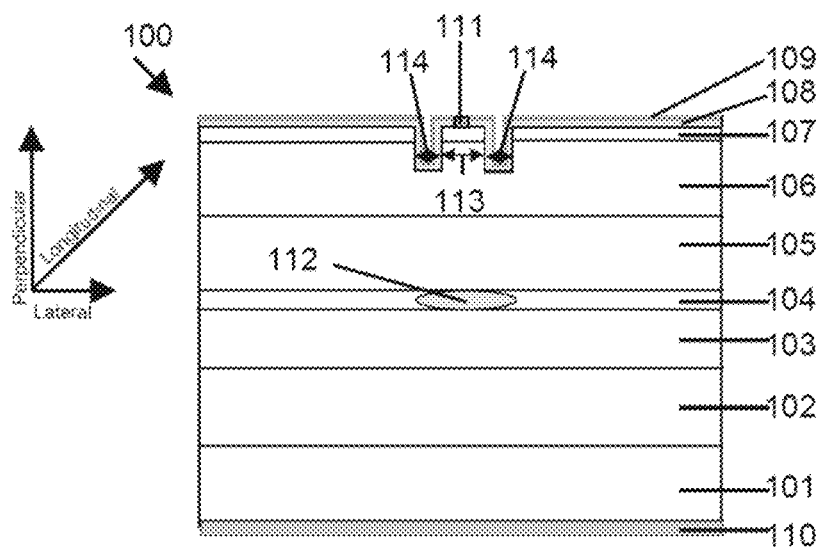
FIG. 1 shows a cross sectional view of a narrow channel ridge waveguide semiconductor structure.

Example embodiments will now be described more fully with reference to the accompanying drawings.

Referring to the drawings, to the following detailed description, and to incorporated materials, detailed information about the apparatus, systems, and methods is provided including the description of specific embodiments. The detailed description serves to explain the principles of the apparatus, systems, and methods described herein. The apparatus, systems, and methods described herein are susceptible to modifications and alternative forms. The application is not limited to the particular forms disclosed. The application covers all modifications, equivalents, and alternatives falling within the spirit and scope of the apparatus, systems, and methods as defined by the claims.

The present invention includes a semiconductor laser structure with diode configuration including a n-type and p-type doped regions with a central active layer, electrical contacts and two parallel optical mirrors forming a laser resonator with a narrow channel lateral waveguide supporting a set of lateral modes with mode tails extending past the channel regions causing higher order modes to experience attenuation loss thereby favoring single lateral mode operation.

Referring to FIG. 1 a narrow channel ridge waveguide semiconductor laser structure 100 is illustrated, the semiconductor epitaxy consisting of a n-type semiconductor substrate 101, a n-type cladding layer 102, a n-type waveguide layer 103, an active layer 104, a p-type waveguide layer 105, a p-type cladding layer 106 and a p-type cap layer 107, the n-type-p-type structure forms a diode structure and supports a single perpendicular mode with significant overlap with the active layer. A lateral waveguide is formed by etching channels 114 into the p-type layers defining a central waveguide region 113 between two parallel narrow channels 114, a dielectric coating 108 with top metal contact layer 109, a bottom contact layer 110, with opening in the dielectric coating 111 to allow electrical contact to the lateral waveguide region. Upon application of an applied bias between the top 109 and bottom 110 contacts current is injected into the active layer within a gain confining region 112 allowing radiative recombination to produce photons supporting a two dimensional modal profile defined by the lateral waveguide and perpendicular waveguides.

Figure 2:
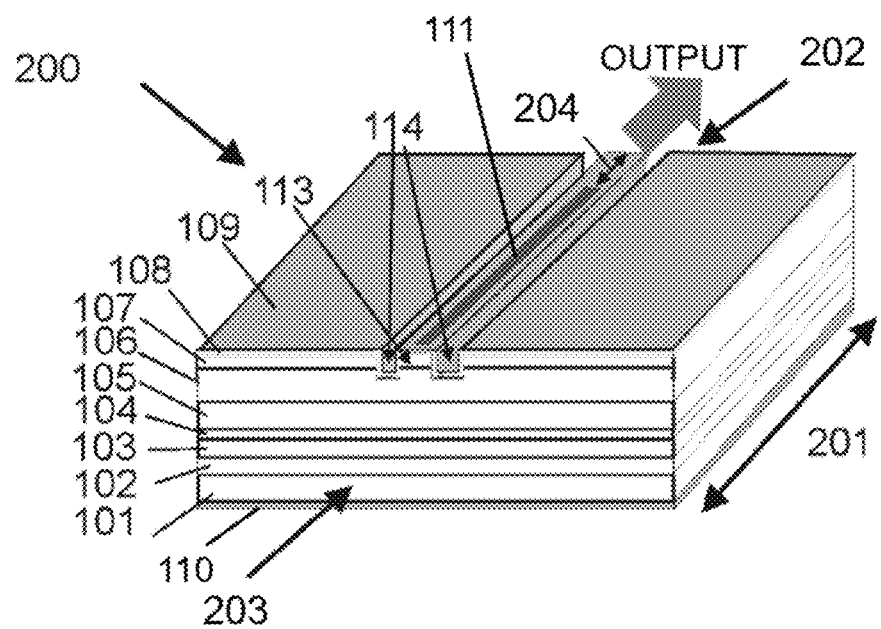
FIG. 2 shows simplified drawing of a narrow channel ridge waveguide semiconductor structure.

Referring to FIG. 2 a three-dimensional drawing of the a narrow channel ridge waveguide semiconductor laser is show. A laser resonator is formed by cleaving the semiconductor 100 into a chip 200 with parallel facets or mirrors 202,203 separated by a cavity length 201. The mirrors may include optical coatings defining a highly reflective coating at facet 203 and lower or antireflection coating on facet 202 to serve as the output mirror. The contact region 111 may be terminated short of the output creating a region 204 devoid of current injection extending from the output facet 202 along the contact region centered along the ridge defined by parallel narrow channels 114 to limit current recombination at the output mirror 202. Upon sufficient applied bias between electrodes 109,110 current injection threshold condition is satisfied and the device is capable of lasing with output out of one or both of the facets.

Figure 3:
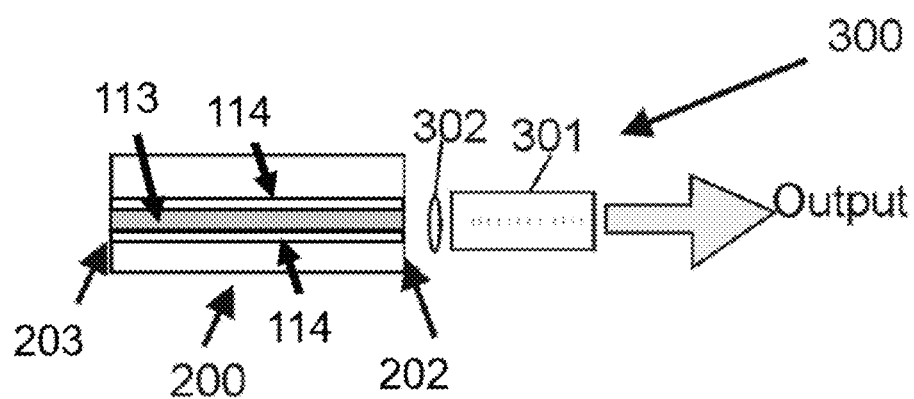
FIG. 3 shows a simplified drawing of a narrow channel ridge waveguide semiconductor gain chip coupled to an external grating to form an external laser resonator.

Referring to FIG. 3 a high level drawing of a narrow channel semiconductor external cavity laser 300 is shown. The semiconductor chip 200 has an anti-reflective coating applied to facet 202 and high reflective coating applied to facet 203 forming a gain chip, the narrow channel gain chip is coupled to an external wavelength selective grating 301 by a coupling lens 302 to enable single frequency operation.

Figure 4:
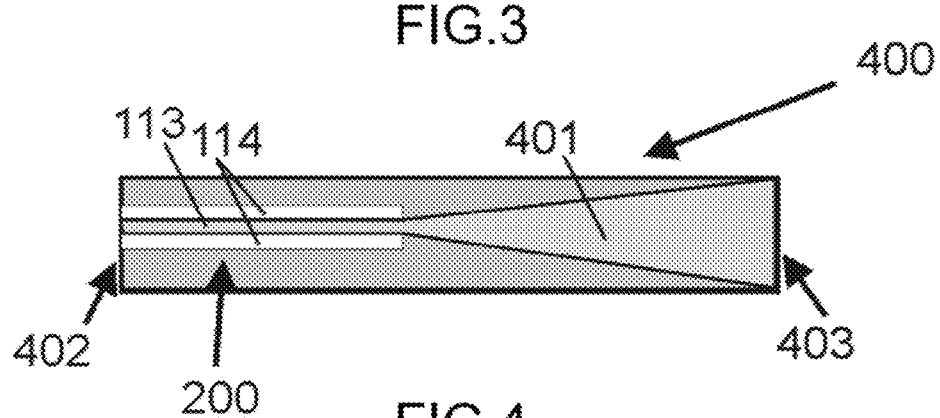
FIG. 4 shows a simplified drawing of a narrow channel ridge waveguide semiconductor laser coupled to an on chip tapered amplifier section.

Referring to FIG. 4 a narrow channel ridge waveguide semiconductor tapered amplifier 400 is shown, a narrow channel ridge waveguide section 200 is coupled to a tapered waveguide region 401 with provides optical amplification, facets 402 and 403 form the mirrors, with the mirror at the tapered end serving as the output facet 403. This device allows for high power single mode operation.

Figure 5:
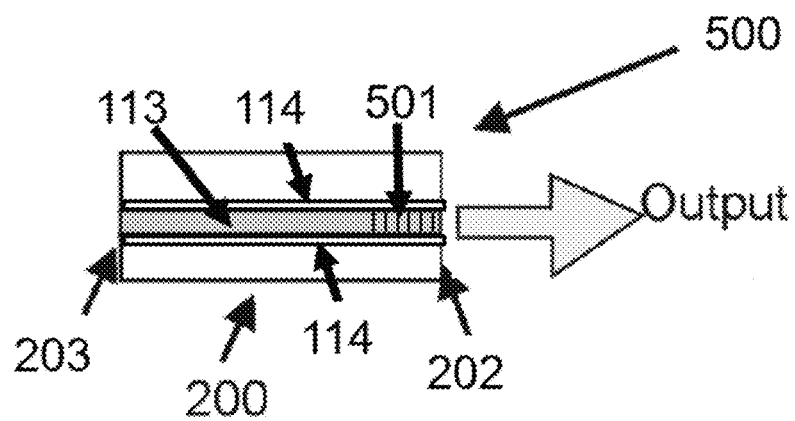
FIG. 5 shows a simplified drawing of a narrow channel ridge waveguide distributed Bragg reflector (DBR) laser.

Referring to FIG. 5 a high level drawing of a narrow channel distributed reflector (DBR) semiconductor laser for single frequency operation. The (DBR) grating 501 is located at one end of the lateral waveguide region 113 external cavity laser 300 is shown.

Figure 6:
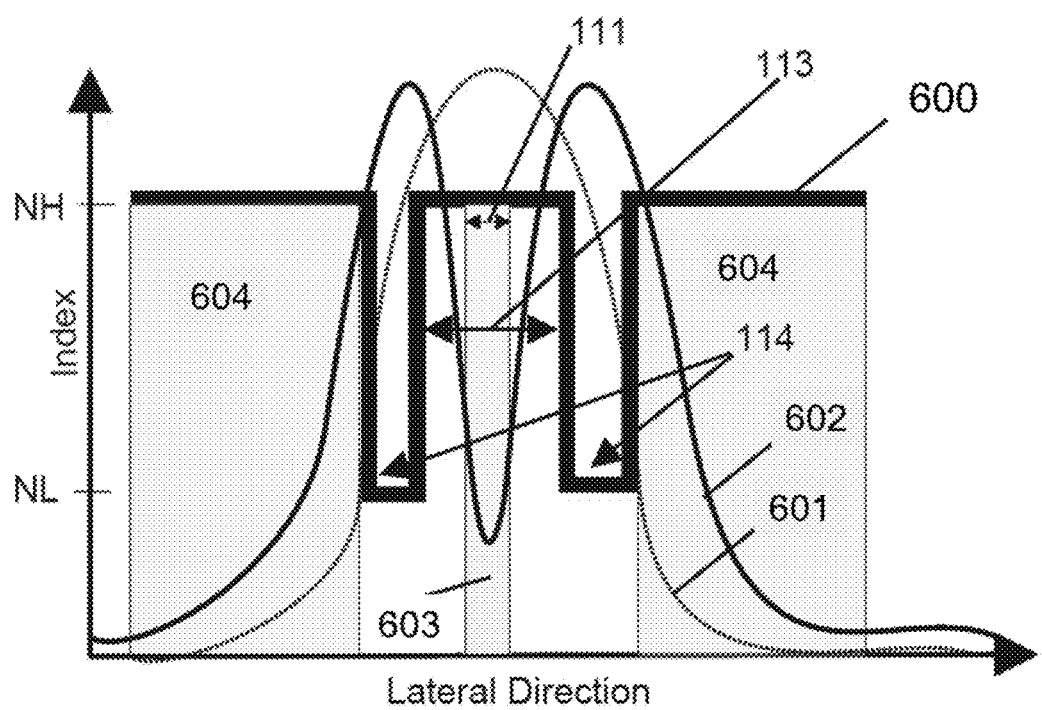
FIG. 6 shows a sketch of the lateral waveguide refractive index profile with supported mode profiles illustrating modal overlap of modes with the outer regions (regions outside the channels).

Referring to FIG. 6, a sketch of the refractive index profile 600 is shown for the narrow channel ridge waveguide structure. The central waveguide region 113 is designed sufficiently wide to support a plurality of modes (the first two are sketched), with the dotted line 601 a sketch of the fundamental mode and 602 a sketch of the first order mode. Region 111 defines the lateral gain region 603 in the active layer 112, the confinement factor is given by the overlap of the gain region with the mode, as can be seen the confinement factor for the fundamental mode will be greater than that of the first mode (with the first mode having a null in the center of the waveguide region). The regions outside the channels 114 are defined by 604, the overlap of the modes with regions 604 define the modal radiation losses, as can be seen in the sketch the mode overlap of the first mode with regions 604 is greater than that of the fundamental mode causing comparatively higher loss. Overall the structure favors fundamental mode operation by supporting a higher confinement factor and lower radiation loss for the fundamental mode compared to high order modes.

The foregoing description of the various embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Although the description above contains many details and specifics, these should not be construed as limiting the scope of the application but as merely providing illustrations of some of the presently preferred embodiments of the apparatus, systems, and methods. Other implementations, enhancements and variations can be made based on what is described and illustrated in this patent document. The features of the embodiments described herein may be combined in all possible combinations of methods, apparatus, modules and systems. Certain features that are described in this patent document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a subcombination or variation of a subcombination. Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Therefore, it will be appreciated that the scope of the present application fully encompasses other embodiments which may become obvious to those skilled in the art. In the claims, reference to an element in the singular is not intended to mean "one and only one" unless explicitly so stated, but rather "one or more." All structural and functional equivalents to the elements of the above described embodiments that are known to those of ordinary skill in the art are expressly incorporated herein by reference and are intended to be encompassed by the present claims. Moreover, it is not necessary for a device to address each and every problem sought to be solved by the present apparatus, systems, and methods, for it to be encompassed by the present claims. Furthermore, no element or component in the present disclosure is intended to be dedicated to the public regardless of whether the element or component is explicitly recited in the claims. No claim element herein is to be construed under the provisions of 35 U.S.C. 112, sixth paragraph, unless the element is expressly recited using the phrase "means for."

While the apparatus, systems, and methods may be susceptible to various modifications and alternative forms, specific embodiments have been shown by way of example in the drawings and have been described in detail herein. However, it should be understood that the application is not intended to be limited to the particular forms disclosed. Rather, the application is to cover all modifications, equivalents, and alternatives falling within the spirit and scope of the application as defined by the following appended claims.

What is claimed is:

1. An apparatus comprising:
a multi-layered epitaxy structure grown on a substrate, the multi-layered epitaxy structure having a plurality of epitaxial layers comprising an active layer stacked in a perpendicular dimension between a first layer and a second layer, the first layer including a dopant of one of an n-type or a p-type and the second layer including a dopant of the other of the n-type or the p-type, the active layer supporting a gain region,
a lateral optical waveguide structure formed on the multi-layered epitaxy structure and comprising a ridge between two channels,
a laser resonator cavity of length defined by a distance between two opposing mirrors, the multi-layered epitaxy structure supporting a single perpendicular mode established by the epitaxial layers with modal overlap with the gain region the laser resonator cavity supporting a plurality of longitudinal modes, and the lateral optical waveguide structure supporting a plurality of lateral modes, and each lateral mode having a modal overlap with regions outside the channels causing modal loss difference between at least some of the plurality of lateral modes, with a fundamental lateral mode having a lowest loss, and
electrical contacts for providing current for the active layer, wherein the gain region has a geometry which is matched to an intensity profile of the fundamental lateral mode, thereby providing a modal gain difference and an attenuation loss difference between the fundamental lateral mode and a remainder of the plurality of lateral modes, with the fundamental lateral mode having a highest modal gain.

2. The apparatus of claim 1, wherein the lateral optical waveguide structure is coupled to a distributed Bragg reflector grating configured to establish single frequency operation.

3. The apparatus of claim 1, wherein the lateral optical waveguide structure is coupled to a distributed feedback grating configured to establish single frequency operation.

4. The apparatus of claim 1, wherein the lateral optical waveguide structure is coupled to a tapered amplifier region for optical amplification.

5. The apparatus of claim 1, wherein the mirrors include: (1) a first facet of the multi-layered epitaxy structure comprising a reflection coating, and (2) an external grating, where a second facet of the multi-layered epitaxy structure comprises an antireflection coating forming a gain chip coupled to the external grating.

6. The apparatus of claim 1, further comprising an optical waveguide coupled to the laser resonator cavity and configured to receive a propagating single mode from the laser resonator cavity.

7. An apparatus comprising:
a plurality of layers of material arranged along a first axis;
a first channel formed through and at least partially bounded by portions of one or more layers of the plurality of layers, where the first channel (1) extends along a second axis that is perpendicular to the first axis, (2) has a channel width along a third axis that is perpendicular to the first axis and the second axis, and (3) has a channel height along an axis parallel to the first axis;

a second channel formed through and at least partially bounded by portions of one or more layers of the plurality of layers, where the second channel (1) extends along an axis that is parallel to the second axis, (2) has a channel width along the third axis, and (3) has a channel height along an axis parallel to the first axis; and a ridge formed from portions of one or more layers of the plurality of layers, where the ridge (1) is adjacent to each of the first channel and the second channel, and (2) extends along an axis that is parallel to the second axis, and (3) has a ridge width along the third axis;

wherein a first layer of the plurality of layers, the ridge, the first channel and the second channel are configured to support a plurality of optical modes, the plurality of optical modes comprising:

a first optical mode defined by a perpendicular mode profile along an axis that is parallel to the first axis, and a first lateral mode profile along an axis that is parallel to the third axis, and a second optical mode defined by a perpendicular mode profile along an axis that is parallel to the first axis, and a second lateral mode profile along an axis that is parallel to the third axis, where the second lateral mode profile is different from the first lateral mode profile.

8. The apparatus of claim 7, wherein a refractive index associated with the ridge is different from a refractive index associated with at least one material filling the first channel and a refractive index associated with at least one material filling the second channel.

9. The apparatus of claim 7, wherein each optical mode of the plurality of optical modes is defined by a different respective lateral mode profile along an axis that is parallel to the third axis, and a single common perpendicular mode profile along an axis that is parallel to the first axis.

10. The apparatus of claim 9, wherein each lateral mode profile of a respective optical mode of the plurality of optical modes at least partially overlaps with an outer region comprising portions of one or more layers of the plurality of layers outside each of the ridge, the first channel, and the second channel.

11. The apparatus of claim 10, wherein an overlap of the first lateral mode profile with the outer region is different from an overlap of the second lateral mode profile with the outer region.

12. The apparatus of claim 7, wherein the channel width of the first channel and the channel width of the second channel are less than a respective width of each of the first lateral mode profile and the second lateral mode profile.

13. The apparatus of claim 7, wherein the channel width of the first channel and the channel width of the second channel are each less than the ridge width.

14. The apparatus of claim 7, wherein the channel width of the first channel and the channel width of the second channel are each between about 1-5 microns, and the ridge width is between about 7-14 microns.

15. The apparatus of claim 7, further comprising a resonator cavity in which the optical modes are propagating, wherein the resonator cavity defines a plurality of longitudinal mode profiles along an axis that is parallel to the second axis, and each optical mode of the plurality of optical modes is further defined by a longitudinal mode profile of the plurality of longitudinal mode profiles.

16. The apparatus of claim 7, wherein the first layer is between a second layer and a third layer of the plurality of layers, where the second layer comprises an n-type dopant and the third layer comprises a p-type dopant.

17. The apparatus of claim 16, further comprising electrical contacts configured to provide current to the first layer.

18. The apparatus of claim 7, further comprising a first facet formed at a first end of the first layer and a second facet formed at a second end of the first layer, where each of the first facet and the second facet is coplanar with a respective plane that is perpendicular to the second axis.

19. The apparatus of claim 18, further comprising an antireflection coating applied to the first facet and a reflective coating applied to the second facet.

20. The apparatus of claim 7, wherein the first layer comprises a gain region, and the first lateral mode profile and the second lateral mode profile provide at least one of: a modal gain difference between the first optical mode and the second optical mode, or an attenuation loss difference between the first optical mode and the second optical mode.

* * * * *